United States Patent
Yang et al.

(10) Patent No.: US 6,974,345 B2
(45) Date of Patent: Dec. 13, 2005

(54) LAND GRID ARRAY CONNECTOR WITH REINFORCEMENT STIFFENER

(75) Inventors: Zhengi Yang, Kunsan (CN); Fujin Peng, Kunsan (CN); Nick Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/026,383

(22) Filed: Dec. 29, 2004

(65) Prior Publication Data

US 2005/0233628 A1    Oct. 20, 2005

(30) Foreign Application Priority Data

Apr. 16, 2004    (TW) .............................. 93110607 A

(51) Int. Cl.⁷ .......................................... H01R 13/62
(52) U.S. Cl. ..................................................... 439/331
(58) Field of Search .................. 439/331, 73

(56) References Cited

U.S. PATENT DOCUMENTS

| | | | |
|---|---|---|---|
| 4,433,886 A * | 2/1984 | Cassarly et al. ............ | 439/331 |
| 5,241,453 A * | 8/1993 | Bright et al. ............... | 439/331 |
| 5,302,853 A * | 4/1994 | Volz et al. .................. | 439/331 |
| 5,485,351 A * | 1/1996 | Hopfer et al. .............. | 439/331 |
| 2004/0259407 A1 * | 12/2004 | Chiang ....................... | 439/331 |

* cited by examiner

Primary Examiner—Tho D. Ta
(74) Attorney, Agent, or Firm—Wei Te Chung

(57) ABSTRACT

An LGA connector (1) comprises a housing (11) for receiving a number of contacts (12), a stiffener (13) partly covering and reinforcing the housing. The stiffener comprises a pair of lateral sides (130), a front end (131) and a rear end (132), and a central cavity (133) disposed therebetween. The sides, the front end and the rear end each define a bottom wall (134) thereof, thereby around the central cavity. A plurality of separately and uniformly protrusions (135) is formed on a bottom surface of the bottom wall. The protrusion and the bottom wall are integrally formed as a single piece by stamping. Thus, the connector is soldered on a circuit board (3) via solder balls (16, 17) on the contacts and the protrusions, thereby preventing the connector from inclining downwardly during in reflow process because of the connecting force between the connector and the board increased.

12 Claims, 7 Drawing Sheets

LAND GRID ARRAY CONNECTOR WITH REINFORCEMENT STIFFENER

BACKGROUND OF THE INVENTION

1. Field of the Invention

The present invention relates to an electrical connector, and more particularly to a land grid array (LGA) connector for electrically connecting an electronic package such as an LGA chip and a circuit substrate such as a printed circuit board (PCB).

2. Description of the Prior Art

Land grid array (LGA) electrical connectors are widely used in the connector industry for electrically connecting LGA chips to printed circuit boards (PCBs) in personal computers (PCs). Conventionally, one kind of the LGA connector mainly comprises an insulative housing, a multiplicity of contacts received therein, a metallic stiffener partly covering and reinforcing the housing, and a metal clip and a cam lever pivotably mounting on two opposite sides of the stiffener. The housing defines a multiplicity of terminal passageways in a rectangular array, for interferentially receiving corresponding terminals. Due to the very high density of the terminal array that an LGA chip may have, the LGA chip needs to be precisely seated on the LGA connector. This is to ensure reliable signal transmission between the terminals and the LGA chip.

Referring to FIGS. 5–7, such a conventional LGA connector 8 typically comprises an insulative housing 80, a plurality of electrical contacts 81 received in corresponding passageways (not labeled) of the housing 80, a metal stiffener 82 partly covering and reinforcing the housing 80, a cam lever 84 pivotably received in a front end 820 of the stiffener 82, and a metal clip 83 pivotably mounted to an opposite rear end 821 of the stiffener 82 for engaging with the cam lever 84. The housing 80 defines four sidewalls (not labeled) and a central cavity disposed between the sidewalls. The central cavity is used for receiving a land grid array (LGA) chip (not shown) therein. Each contact 81 has a contact portion protruding outwardly from an upper surface of the housing 80, for electrically connecting with a corresponding metal contact pad of the LGA chip that is received in the LGA connector 8, and a solder portion mounted on a printed circuit board (PCB) 9 (see FIG. 7) via a surface mounted solder ball 85 (see FIG. 7). The clip 83 comprises two opposite sides 830. A pair of pressing portions 831 is provided in respective middle portions of the sides 830, for pressing the LGA chip engaging with the terminals 81.

When the LGA connector 8 is electrically connected the PCB 9 and the LGA chip, firstly curing the solder ball 85 at high temperature in a convention cabinet using infrared radiant heaters, heat air can flow through the passageways to a bottom portion of the housing 80 to make the adhesive film of the contacts 81 activated quickly. The solder balls 85 of the contacts 81 melt and connect the corresponding contact pads attached on an upper surface of the PCB 9 so that the LGA connector 8 is electrically connected with the PCB 9. After cooled and frozen, the contacts 81 of the connector 8 is reliably and electrically soldered onto the PCB 9. Secondly, engaging the LGA chip with the LGA connector 8, the clip 83 is rotated upward. The LGA chip is placed in the central cavity of the housing 80. The clip 83 is rotated from a vertical portion to a horizontal portion to make the two opposite sides 830 of the clip 83 attach on corresponding sides of the LGA chip. The cam lever 84 is rotated to drive the clip 83 to gradually approach the housing 80 until the pressing portions 831 of the clip 83 press the LGA chip downwardly to make the contact pads of the LGA chip contact with the contact portions of the terminals 81 and make the LGA chip received in the central cavity therein. As a result, mechanical and electrical engagement between the LGA chip and the PCB 9 via the LGA connector 8 is attained.

However, it is desirable to solder some other electrical elements on a bottom surface of the PCB 9 after the LGA connector 8 is soldered on the upper surface of the PCB 9, so the PCB must be turned over and subjected to a reflow process with the LGA connector 8 already in place. In the reflow process, the solder balls 85 will melt again so that the LGA connector 8 connects with the PCB 9 only via an exterior tensility of the activated solder balls 85. Thus the LGA connector 8 will tend to incline downwardly because the center of gravity of the LGA connector 8 is near to the front end 820 of the stiffener 82. The solder balls 85 adjacent to the front end 820 may become disconnected from the contact pads of the PCB 9. When this happens, electrical engagement between some of the contacts 81 and the corresponding contact pads of the PCB 9 may be flawed. The LGA connector 8 may not reliably electrically connect with the PCB 9.

Thus, there is a need to provide a new LGA connector that overcomes the above-mentioned problems.

SUMMARY OF THE INVENTION

Accordingly, an object of the present invention is to provide a land grid array (LGA) connector which has a reinforcement stiffener, wherein the stiffener is configured to securely and reliably mounted onto a printed circuit board (PCB) during an invented solder reflow process by providing fasten metal ears soldered on the PCB.

To fulfill the above-mentioned object, an LGA connector in accordance with a preferred embodiment of the present invention comprises an insulative housing, a plurality contacts received therein, a metallic stiffener partly covering and reinforcing the housing, and a metal clip and a lever pivotally mounted on opposite ends of the housing. The housing defines a generally rectangular cavity for receiving an electronic package such as an LGA central processing unit (CPU) therein. A multiplicity of passageways is defined in a portion of the housing around the cavity, for receiving a corresponding number of the contacts therein. The stiffener comprises a pair of lateral sides each having an L-shaped cross-section, a front end having a U-shaped cross-section, and a rear end having an L-shaped cross-section. The side, the front end and the rear end each have a bottom thereof, and a plurality of separately and uniformly protrusions is formed on a bottom surface of the bottom wall. The protrusion and the bottom wall are integrally formed as a single piece by stamping. The protrusion has a solder surface for soldering the stiffener onto a PCB via a surface mounted solder ball. A diameter of the solder ball mounted on the protrusion is larger than that of the solder ball mounted on the contact and the two solder balls is coplanarly soldered with a corresponding contact pads of the PCB so that the LGA connector is securely and reliably mounted onto the PCB. Which can prevent the LGA connector from inclining downwardly during in reflow process.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
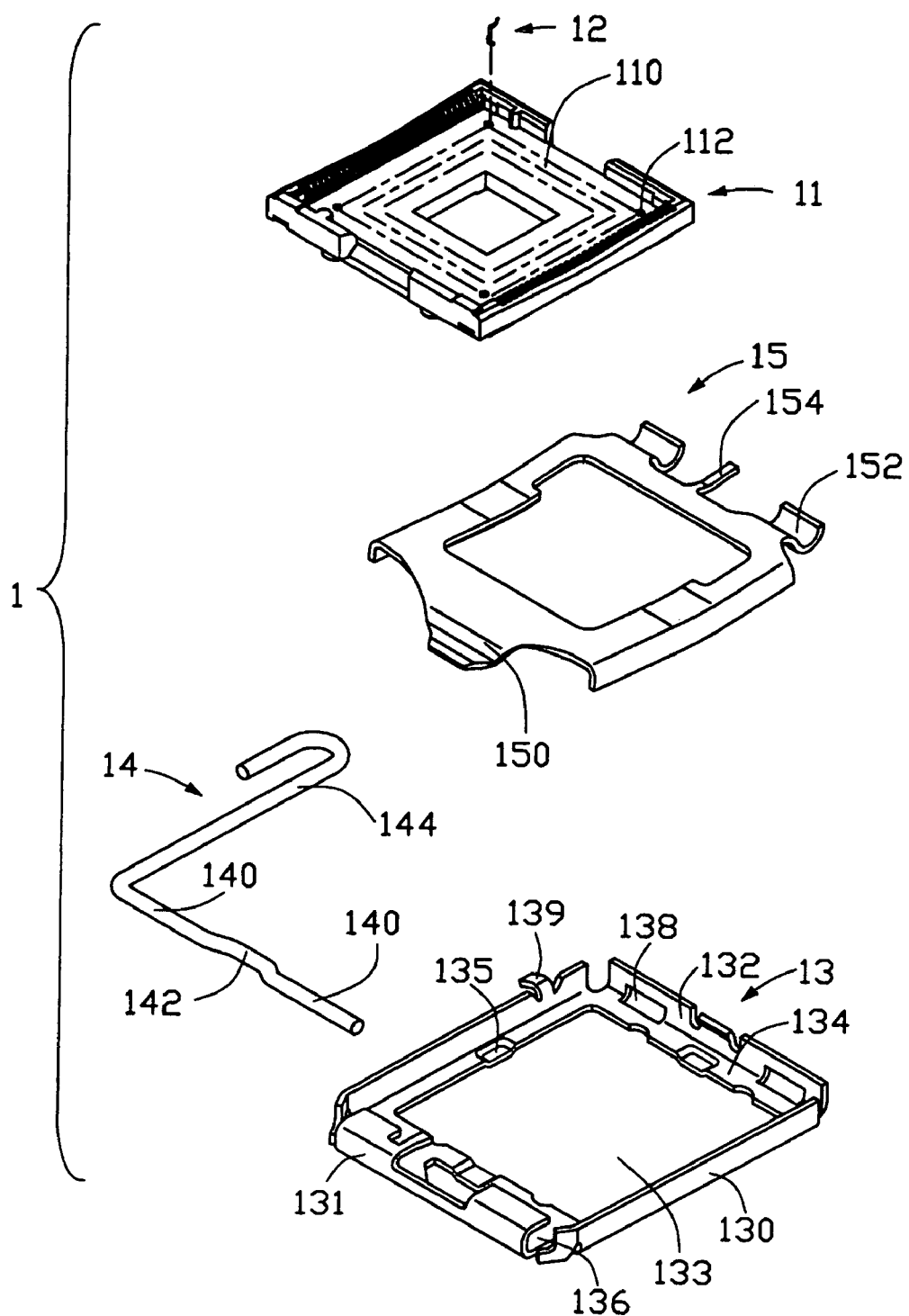
FIG. 1 is an exploded, isometric view of an LGA connector in accordance with a preferred embodiment of the present invention.
Figure 2:
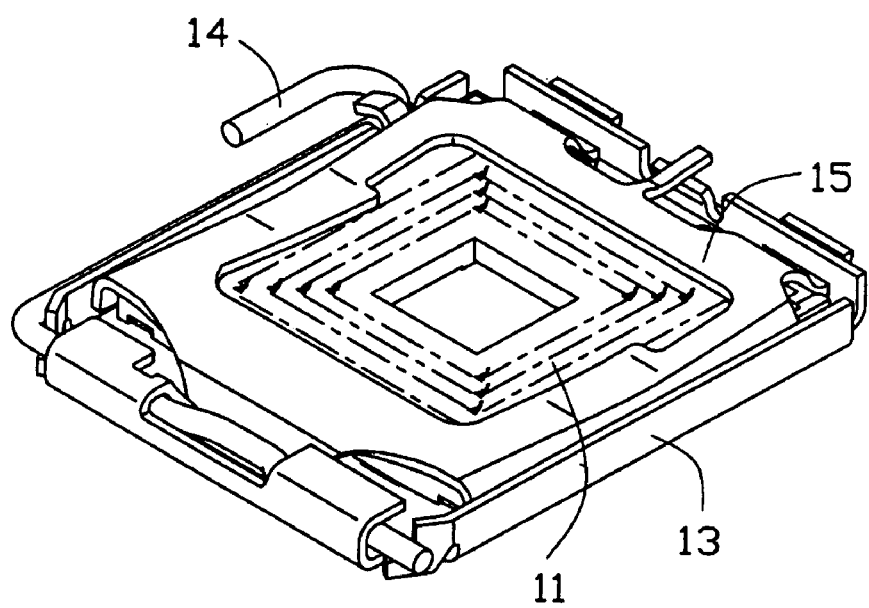
FIG. 2 is an assembly view of FIG. 1.

FIG. 1 is an exploded, isometric view of a land grid array (LGA) connector 1 in accordance with the preferred embodiment of the present invention. The LGA connector 1 is provided for electrically connecting an electronic package, such as an LGA chip (not shown) and a circuit substrate, such as a printed circuit board (PCB) 3 (see FIG. 4). The LGA connector 1 comprises a generally rectangular insulative housing 11, a multiplicity of contacts 12 received in the housing 11, a metal stiffener 13 partly covering and reinforcing the housing 11, a lever 14 pivotably received in an end of the stiffener 13, and a metal clip 15 pivotably mounted to an opposite end of the stiffener 13 for engaging with the lever 14.

The housing 11 defines a generally rectangular cavity 110 in a middle thereof. The cavity 110 is used for receiving the LGA chip therein. A multiplicity of passageways 112 is defined in a portion of the housing 11 under the cavity 110, the passageways 112 receiving a corresponding number of the contacts 12 therein respectively. Each contact 12 has a contacting portion (not labeled) protruding outwardly from a top face of the cavity 110 of the housing 11, for resiliently electrically contacting a corresponding pad of the LGA chip, and a solder portion mounted on the PCB 3 via a first surface mounted solder ball 16 (see FIG. 4).

Figure 3:
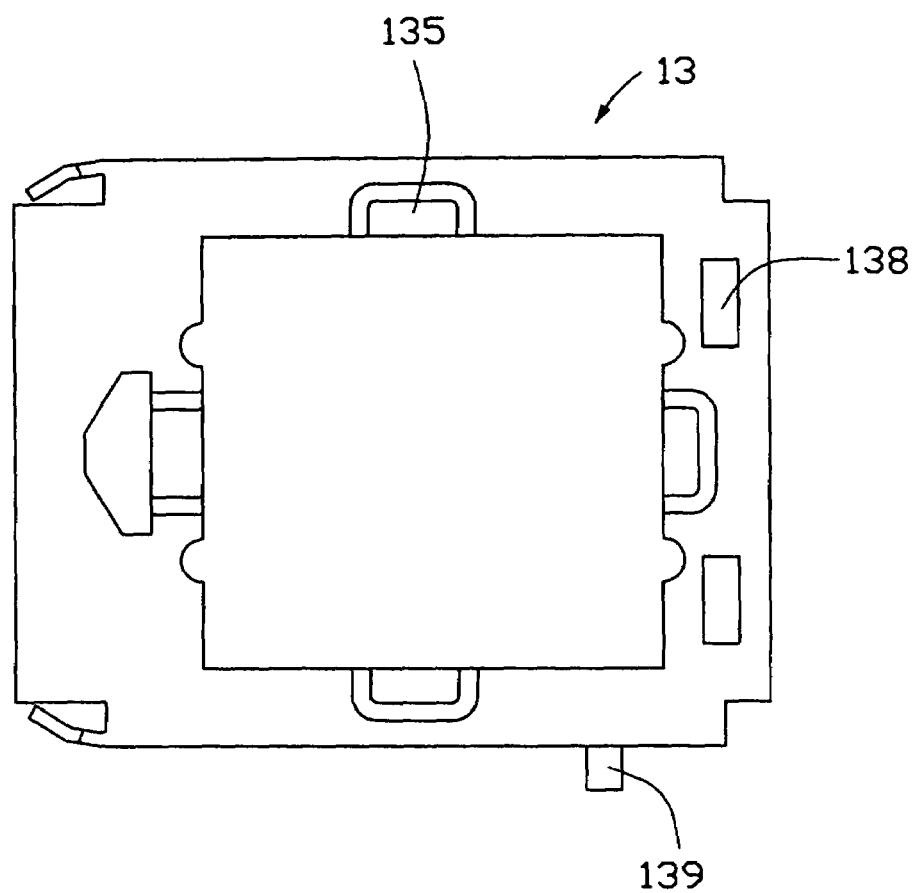
FIG. 3 is a bottom view of a stiffener of the connector in accordance with the present invention.

Referring to FIGS. 1 and 3, the stiffener 13 comprises a pair of lateral sides 130 each having an L-shaped cross-section, a front end 131 having a U-shaped cross-section, and a rear end 132 having an L-shaped cross-section, and a central cavity 133 disposed therebetween. The housing 11 is fittingly received in the central cavity 133 of the stiffener 13. The sides 130, the front end 131 and the rear end 132 each define a bottom wall 134 thereof, thereby around the central cavity 133. A plurality of separately and uniformly protrusions 135 is formed on a bottom surface of the bottom wall 134. The protrusion 135 and the bottom wall 134 are integrally formed as a single piece by stamping. The protrusion 135 has a solder surface (not labeled) for soldering the stiffener 13 onto the PCB 3 via a second surface mounted solder ball 17. A diameter of the second solder ball 17 is larger than that of the first solder ball 16 and the first and second solder balls 16, 17 is coplanarly soldered with a corresponding contact pads of the PCB 3 so that the LGA connector 1 is securely and reliably mounted onto the PCB 3. An elongate chamber 136 is defined in the front end 131 of the stiffener 13. A pair of spaced slots 138 is defined in the rear end 132 of the stiffener 13. An ear 139 extends arcuately from an edge of one of the lateral sides 130 of the stiffener 13.

The lever 14 comprises a pair of locating portions 140 pivotably received in the chamber 136 of the stiffener 13, an offset actuating portion 142 between the locating portions 140, and an operating portion 144 extending perpendicularly from an end of one of the locating portions 140. The operating portion 144 is disposed outside of the stiffener 13. When oriented at a horizontal position parallel to the housing 11, the operating portion 144 engages with the ear 139.

The clip 15 defines a generally rectangular window (not labeled) in the middle thereof. The clip 15 comprises an engaging portion 150 extending arcuately from an end thereof, a pair of spaced securing portions 152 extending arcuately from an opposite end thereof and pivotably received in the slots 138 of the stiffener 13, and a tail 154 between the securing portions 152. When the clip 15 is oriented at a horizontal position parallel to the housing 11, the engaging portion 150 of the clip 15 is engaged with the actuating portion 142 of the lever 14, and the clip 15 thereby presses the LGA chip onto the contacts 12. When the clip 15 is oriented at a position perpendicular to the housing 11, the tail 154 abuts against the stiffener 13 to prevent the clip 15 from being over-rotated.

Figure 4:
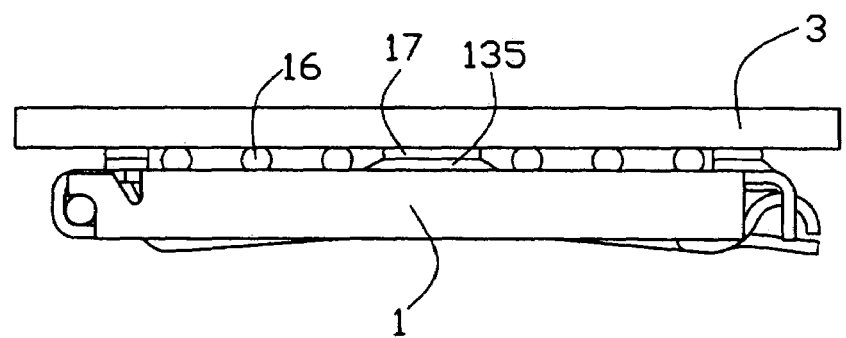
FIG. 4 is a side view of the connector engaged with a printed circuit board, showing the connector and the board inverted.
Figure 5:
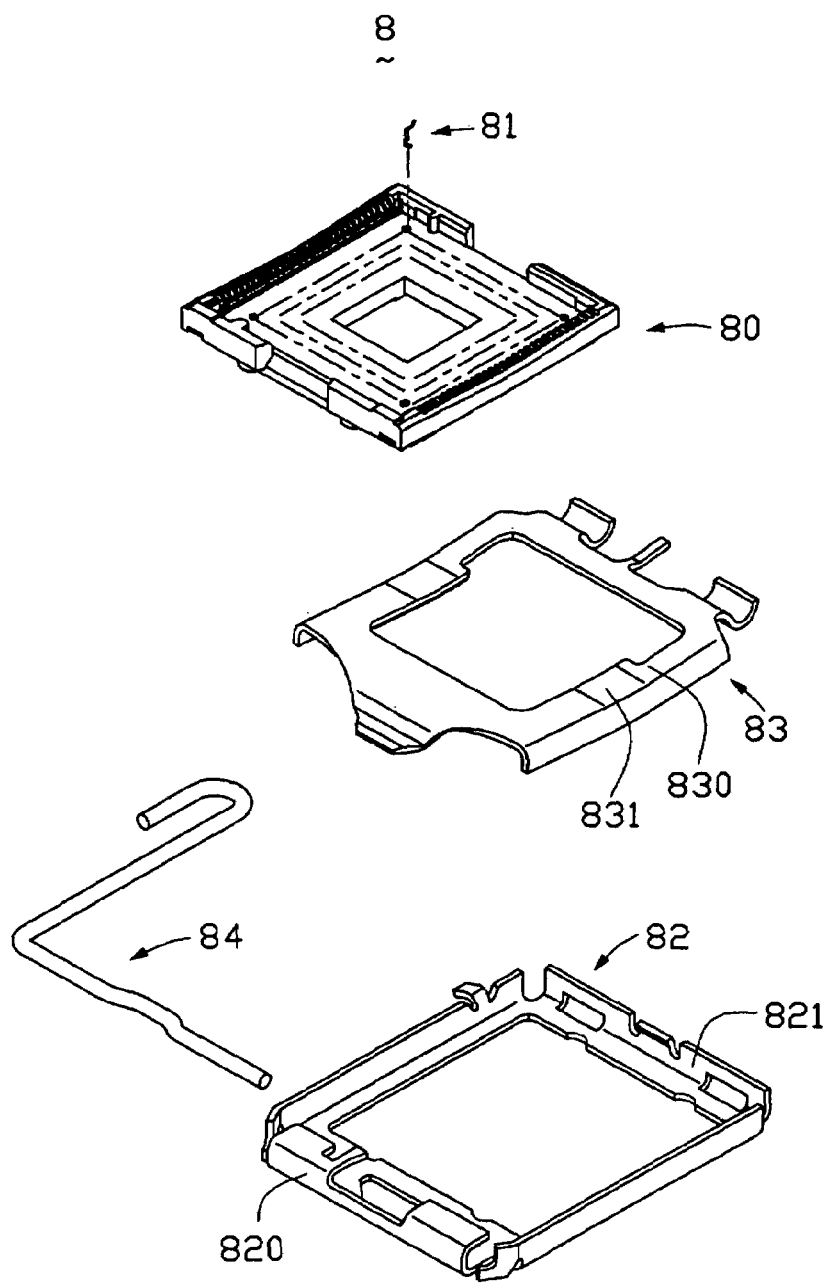
FIG. 5 is an exploded, isometric view of a conventional LGA connector.
Figure 6:
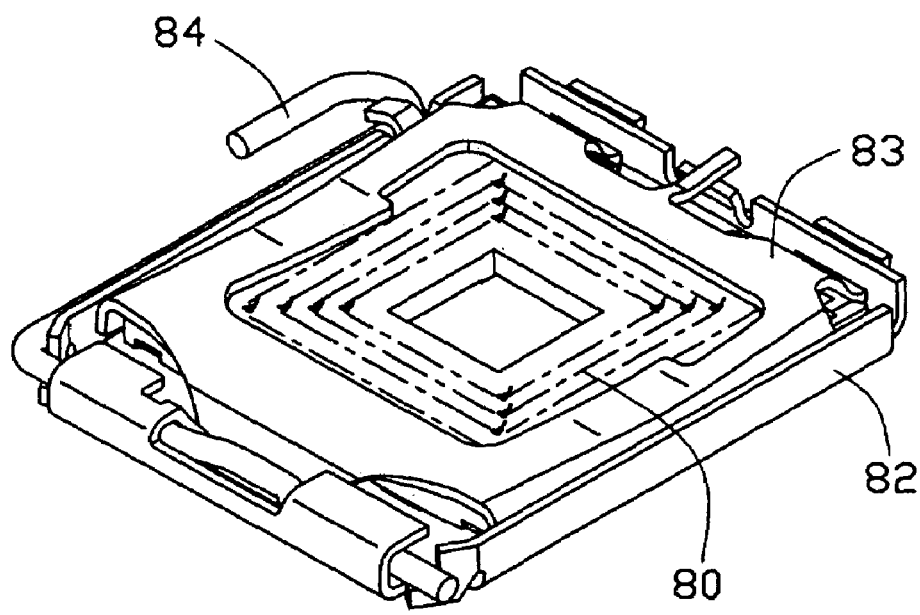
FIG. 6 is an assembly view of FIG. 5.
Figure 7:
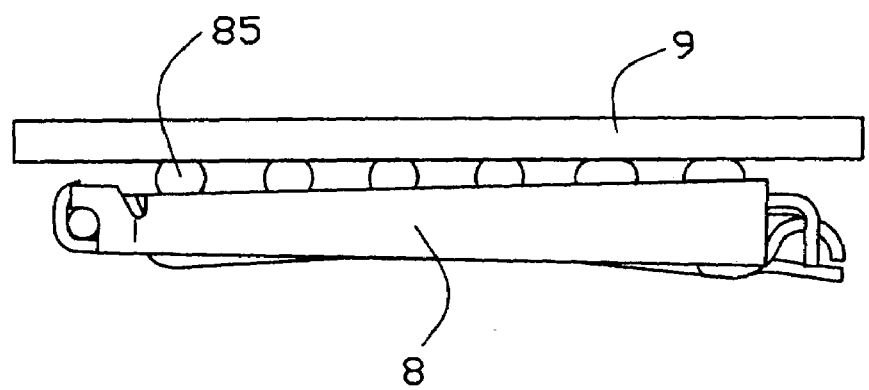
FIG. 7 is a side view of the conventional connector engaged with a printed circuit board, showing the connector and the board inverted.

Referring to FIG. 4, the LGA connector 1 is soldered on the PCB 3 with the second solder balls 17 on the protrusions 135 of the stiffener 13 and the first solder ball 16 on the contacts 12 being soldered on corresponding contact pads of the PCB 3 together. The mating force between the LGA connector 1 and the PCB 3 is increased, thereby securely and reliably electrical connection between the LGA connector 1 and the PCB 3 is obtained. When the PCB 3 is turned over and subjected to a backside reflow process together with the LGA connector 1, the first and second solder balls 16, 17 are heated. The LGA connector 1 does not incline downwardly because of the connecting force between the first and second solder balls 16, 17 and the PCB 3.

As will be appreciated from the foregoing description, the protrusion 135 of the stiffener 13 is integrally stamped with the bottom wall 134, with the protrusion 135 extending downwardly from a bottom surface of the bottom wall 134. Rather than being stamped, the protrusion 135 may alternatively be soldered on the stiffener 13, interferentially fixed on the stiffener 13 or another suitable combination way together with the stiffener 13. Whatever combination way between the protrusion 135 and the stiffener 13 takes, it can increase the connecting force between the LGA connector 1 and the PCB 3 and prevent the LGA connector 1 from inclining downwardly during in reflow process.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A land grid array (LGA) connector for electrically connecting an electronic package and a printed circuit board (PCB), comprising:

an insulative housing defining a substantially rectangular cavity in a middle thereof, the cavity being adapted for receiving the electronic package therein;

a plurality of electrical contacts received in the housing;

a metal clip disposed on the housing to press the electronic package upon the contacts; and a metallic stiffener partly covering, surrounding and reinforcing the housing, said stiffener comprising a plurality of side walls joined with a horizontal bottom wall thereof, and a plurality of protrusions extending downward from a bottom surface of the bottom wall, the protrusion integrally stamped with the bottom wall; wherein the contacts and the protrusions can solder onto a circuit substrate, thereby preventing the connector from inclining downwardly during the substrate in reflow process; wherein the connector further comprises a lever pivotably received in an end of the stiffener.

2. The LGA connector as claimed in claim 1, wherein the protrusion is soldered on the stiffener or interferentially fixed on the stiffener.

3. The LGA connector as claimed in claim 1, wherein the protrusion is interferentially fixed on the stiffener.

4. The LGA connector as claimed in claim 1, wherein the stiffener comprises a pair of lateral sides each having an L-shaped cross-section, a front end having a U-shaped cross-section, and a rear end having an L-shaped cross-section.

5. The LGA connector as claimed in claim 1, wherein the protrusion and the bottom wall are integrally formed as a single piece by stamping.

6. The LGA connector as claimed in claim 5, wherein the protrusion has a solder surface for soldering the stiffener onto the PCB via a surface mounted solder ball.

7. The LGA connector as claimed in claim 6, wherein a diameter of the solder ball onto the protrusion is larger than corresponding solder ball onto the contact, and the two solder balls is coplanarly soldered with a corresponding contact pads of the PCB.

8. A land grid array (LGA) connector for electrically connecting an electronic package and a printed circuit board (PCB), comprising:

an insulative housing defining a substantially rectangular cavity in a middle thereof, the cavity being adapted for receiving the electronic package therein;

a plurality of electrical contacts received in the housing with corresponding solder balls extending out of a mounting face of the housing;

a moveable metal clip disposed on the housing to press the electronic package upon the contacts;

a moveable lever disposed around one end of the housing to lock the clip in position; and a metallic stiffener partly covering, surrounding and reinforcing the housing, said stiffener comprising a plurality of side walls joined with a horizontal mounting wall thereof, and a plurality of protrusions outwardly formed on a mounting surface of the mounting wall opposite to said housing, said mounting wall defining a central cavity through which the solder balls of the contacts extend; wherein said protrusions are vertically dimensioned to cooperate with the solder balls for being commonly positioned on said printed circuit board to which said connector is mounted; wherein said protrusions are arranged around a periphery area of said central cavity.

9. The connector as claimed in claim 8, wherein said protrusions integrally extend from the mounting surface of the mounting wall.

10. An electrical connector assembly comprising:

a printed circuit board;

an insulative housing located above and printed circuit board and defining a substantially rectangular cavity in a middle thereof, the cavity being adapted for receiving an electronic package therein;

a plurality of electrical contacts received in the housing with corresponding solder balls extending out of a mounting face of the housing;

a moveable metal clip disposed on the housing to press the electronic package upon the contacts;

a moveable lever disposed around one end of the housing to lock the clip in position; and a metallic stiffener partly covering, surrounding and reinforcing the housing, said stiffener comprising a plurality of side walls joined with thereof a horizontal mounting wall, which is parallel to the printed circuit board, and a plurality of protrusions outwardly formed on a mounting surface of the mounting wall opposite to said housing, said mounting wall defining central cavity through which the solder balls of the contacts extend; wherein the mounting surface of the mounting wall is slightly spaced from the printed circuit board while said protrusions are vertically dimensioned to cooperate with the solder balls for being commonly positioned on said printed circuit board; wherein both said solder balls and said protrusions are fastened to the printed circuit board.

11. The assembly as claimed in claim 10, wherein said protrusions integrally extend from the mounting surface of the mounting wall.

12. The connector as claimed in claim 10, wherein said protrusions are arranged around a periphery area of said central cavity.

* * * * *